US006440857B1

(12) United States Patent
Li et al.

(10) Patent No.: US 6,440,857 B1
(45) Date of Patent: Aug. 27, 2002

(54) TWO-STEP CMP METHOD AND EMPLOYED POLISHING COMPOSITIONS

(75) Inventors: Yuan-Hsin Li, Chung-Li; Ming-Shin Tsai, Kaohsiung; Chien-Hua Chiu, Taipei; Bau-Tong Dai, Hsinchu Hsien; Ting-Chen Hu, Hsinchu, all of (TW)

(73) Assignee: Everlight USA, Inc., Pineville, NC (US)

( * ) Notice: Subject to any disclaimer, the term of this patent is extended or adjusted under 35 U.S.C. 154(b) by 0 days.

(21) Appl. No.: 09/768,339

(22) Filed: Jan. 25, 2001

(51) Int. Cl.[7] .......................................... H01L 21/4763
(52) U.S. Cl. ...................................... 438/692; 438/627
(58) Field of Search .............................. 438/627, 626, 438/643, 645, 648, 653, 656, 692, 685, 688

(56) References Cited

U.S. PATENT DOCUMENTS

| 5,899,738 | A | * | 5/1999 | Wu et al. ..................... 438/618 |
|---|---|---|---|---|
| 6,001,730 | A | * | 12/1999 | Farkas et al. ................ 438/627 |
| 6,004,188 | A | * | 12/1999 | Roy .............................. 451/41 |
| 6,191,039 | B1 | * | 2/2001 | Chang et al. ................ 438/692 |
| 6,194,313 | B1 | * | 2/2001 | Singh et al. ................. 438/675 |
| 6,235,633 | B1 | * | 5/2001 | Jang ............................ 438/675 |

* cited by examiner

*Primary Examiner*—David Nelms
*Assistant Examiner*—David Nhu
(74) *Attorney, Agent, or Firm*—Bacon & Thomas

(57) ABSTRACT

The present invention discloses a two-step CMP method and employed polishing compositions. In the first step, a first polishing slurry is provided to selectively polish the Al-alloy layer. Next, a second polishing slurry is provided to selectively polish the barrier layer. Accordingly, undesired surface non-planarity after the CMP process, such as metal dishing and corrosion of dielectric layers with complicated pattern geometry, can be avoided, and thus the planarization of wafer surfaces can be achieved.

2 Claims, No Drawings

TWO-STEP CMP METHOD AND EMPLOYED POLISHING COMPOSITIONS

BACKGROUND OF THE INVENTION

1. Field of the Invention

The present invention relates to a two-step CMP (chemical-mechanical polishing) method and the employed polishing compositions and, more particularly, to a two-step CMP method and the employed polishing compositions suitable for planarizing wafer surfaces containing Al-alloy interconnections.

2. Description of Related Art

To satisfy a demand for high integration and multi-functions chips, the processes to form multi-layer metal interconnect thereon are developing. However, owing to the sever DOF limit for deep sub-micron photo-lithography, the wafer surfaces with interconnect topography need to be planarized via a polishing process, such as chemical-mechanical polishing (CMP).

In a CMP process, the removal rates, removal non-uniformity and surface roughness are mainly determined by the polishing compositions. For example, a proper formulation could be obtained by tuning solution pH, oxidants, and concentrations thereof, or various mechanical stress can be controlled by using different abrasives, varied particle sizes, and suspension conditions.

In general, the polishing conditions and slurries would be optimized in order to obtain higher throughput, and completely remove the barrier layer, such as Ti and TiN, outside of the wiring trenches. For example for polishing the Al-alloy layer, over 4000 Å/min removal rates and less than 5% removal non-uniformity are required for the throughput taken into account. However, overpolish to insure against complete removal of Ti barrier would lead to sever Al dishing inside the wiring trenches and dielectric erosion around. Furthermore, dishing and erosion would be complicated with the pattern layout, especially for larger and denser patterns.

Therefore, it is desirable to provide an improved method to mitigate and/or obviate the aforementioned problems.

SUMMARY OF THE INVENTION

The main object of the present invention is to provide a two-step CMP method, which can rapidly planarize wafer surfaces.

The second object of the present invention is to provide CMP compositions, which can be employed in the above two-step method.

The further object of the present invention is to provide CMP compositions, which can be utilized for selectively polishing an Al-alloy layer or a barrier layer, so that metal dishing and erosion of dielectric layers can be avoided.

To achieve the above objects, the two-step CMP method of the present invention is performed first by polishing the Al-alloy layer in a first polishing slurry composed of one kind of abrasives, a buffer, a metal polishing promoter, an oxidant, and deionized water. Next, a second polishing slurry composed of one kind of abrasives, a pH buffer, a dielectric layer protector, an oxidant and deionized water is provided to polish the barrier layer.

For the first polishing slurry of the present invention, the abrasive, the oxidant, and the metal polishing promoter can be $Al_2O_3$, $H_2O_2$, and $H_3PO_4$ respectively. For the second polishing slurry of the present invention, the abrasive, the oxidant, and the dielectric layer protector can be $Al_2O_3$, $H_2O_2$, and tetra-butyl ammonium hydroxide (TBAH) respectively.

It is a further feature of the present invention that the barrier layer is selectively removed by inhibiting removal of the Al-alloy layer and the $SiO_2$ dielectric layer in the second step. As a result, the problems such as metal dishing and erosion of dielectric layers often found in semiconductors with complicated pattern geometry are effectively solved.

Other objects, advantages, and novel features of the invention will become more apparent from the following detailed description.

DETAILED DESCRIPTION OF THE PREFERRED EMBODIMENT

The present invention provides a CMP process carried out in two steps, in which two slurries are respectively employed to selectively remove the metal interconnection such as an Al-alloy layer, or the barrier layer such as a Ti/TiN layer. In such a process, a CMP slurry providing conventional functions is used in the first stage, plus an additional polishing slurry featured with the higher removal rates for polishing the barrier layer than for the metal layer is involved in the second stage.

Therefore, the chemical-mechanical polishing method of the present invention primarily includes steps of:

(A) polishing the metal layer with the first polishing slurry composed of one kind of abrasives, a pH buffer, a metal polishing promoter, an oxidant, and deionized water; and (B) polishing the barrier layer with the second polishing slurry composed of one kind of abrasives, a buffer, a dielectric layer protector, an oxidant, and deionized water.

The abrasive aforementioned can be metal oxides, such as $Al_2O_3$, $SiO_2$, $CeO_2$, $ZrO_2$, $TiO_2$, and mixtures thereof.

The pH buffer used in the present invention can be oxalic, citric acid or salts thereof, for the purpose of control slurry pH to compensate pH variation from varied oxidative or corrosive environments, and to stabilize the removal rates of metals. For example, the removal rates of polishing Al-alloy at neutral slurry pH would be significantly dropped, but the removal rates of polishing Ti and TiN Would be enhanced with the alkaline slurry.

$H_3PO_4$ is functioned as a metal polishing promoter in the present invention.

The oxidant can be peroxides such as $H_2O_2$, transition metal complexes such as $Fe(NO_3)_3$ and $K_3Fe(CN)_6$, or halide peroxides such as $ClO_4^-$ and $IO_3^-$. Moreover, the removal rates of polishing metal are critically dependent upon the concentration of oxidants in the slurry. It is related to the corrosion and surface passivation of the metal being polished. For example, the removal rates of polishing Ti/TiN increase with the concentration of oxidants in slurry, however, the removal rates of polishing Al-alloy would be maximum only at a critical concentration of oxidants, but decreases in excess oxidants.

The dielectric layer protector of the present invention can be polar components such as glycol, or charged but non-polarized components such as tetrabutyl ammonium hydroxide (TBAH), tetramethyl ammonium, tetraethyl ammonium, ammoniates, and salts or hydroxides thereof.

The following Examples are used to explain the present invention, wherein Examples 1–4 refers to the removal selectivities of Al alloys, Ti, TiN, and silicon dioxide thin films. Examples 5–10 refers to the applications of polishing patterned wafers by the present invention.

The first polishing slurry used in the Examples is composed of 30–99 wt. % deionized water, 0.5–60 wt. % $Al_2O_3$ as the abrasive, 0.01–10 wt. % $H_3PO_4$ as the metal polishing promoter, and 0.1–30 wt. % $H_2O_2$ as the oxidant.

The second polishing slurry used in Examples is composed of 30–99 wt. % deionized water, 0.5–60 wt. % $Al_2O_3$ as the abrasive, 0.01–10 wt. % TBAH as dielectric layer protector, and 0.1–30 wt. % $H_2O_2$ as oxidant.

The end points of the polishing processes can be determined by polishing time, film thicknesses, electrical current changes of the carrier motor, or temperature changes on the polish pad.

EXAMPLE 1

(1) Preparing the First Polishing Slurry and Performing the First Step 42 g citric acid (pH buffer), 10 g $H_3PO_4$ (metal polishing promoter), and 100 g $Al_2O_3$ (abrasive) are added into 1 liter deionized water to form a mixture, which is then mixed well with 333.3 ml, 30 wt. % $H_2O_2$, and diluted by deionized water to a total volume of 2 liters. The slurry pH is controlled at 2 by adding KOH pellets, and the first polishing slurry is obtained.

Next, a blanket sample, marked as 1, is polished in the first polishing slurry. Sample 1 includes an experimental Al-alloy plane (98.5% Al, 0.5 % Si, 1% Cu, 1 μm thick), Ti (about 4,000 Å thick) and TiN (50% Ti, 50% N, about 5,000 Å thick).

In this Example, polishing experiments were carried out on the IPEC/Westech372M polisher with the Rodel Politex Regular Embossed pad on the polish platten and the RODEL R200-T3 back film mounted on the carrier. The downward and back pressures were set to be 5 psi and 2 psi, the rotating speeds of polish platen and carrier were set to be 60 rpm and 65 rpm, and the slurry was dispensed at 150 ml/min flow rate onto the center of the pad and sprayed out uniformly by platen rotation.

(2) Determining the Removal Rates and Removal Selectivities in the First Step

After the first polishing, the sheet resistances of Sample 1 was measured by a four points probe, the thickness could be calculated with the resistivity of the metal being studied, and to obtain removal rates of the Al-alloy layer, the Ti barrier layer and the TiN barrier layer respectively at 6,480 Å/min, 540 Å/min, and 540 Å/min. Accordingly, the removal selectivity between the Al-alloy layer and the Ti barrier layer is 12.

(3) Preparing the Second Polishing Slurry and Performing the Second Step 42 g citric acid (2.1 wt. %), 13 g TBAH (dielectric layer protector, 0.65 wt. %), and 60 g $Al_3O_3$ (abrasive, 3.0 wt. %) were added into 1 liter deionized water to obtain a mixture, which is then mixed well with 666.6 ml, 30 wt. % $H_2O_2$ (10 wt. %), and diluted with deionized water to a total volume of 2 liters. The slurry pH was controlled at 3 by adding KOH pellets, and the second polishing slurry is obtained.

The sample 1 is then polished in the second polishing slurry to remove the barrier layer. In this stage, the downward and back pressures were respectively set to be 5 psi and 2 psi, the rotating speeds of the platen and the carrier were respectively set to be 45 rpm and 42 rpm, the slurry was dispensed at 150 ml/min flow rate onto the center of the pad and sprayed out uniformly by platen rotation.

(4) Determining the Removal Rates and Removal Selectivities in the Second Step

After polishing the barrier layer, the sheet resistances of sample 1 was measured by a four points probe, the thickness could be calculated with the resistivity of the metal being studied, and to obtain removal rates of the Al-alloy layer, the Ti barrier layer, the TiN barrier layer and the $SiO_2$ dielectric layer respectively at 526 Å/min, 1,171 Å/min, 1,367 Å/min and 57 Å/min. Accordingly, the removal selectivity between Al-alloy layer and Ti barrier layer is 0.45.

EXAMPLES 2–4

By repeating the steps of Example 1, but changing the pH values of the second polishing slurry in step (3) at 4, 5 and 6, the removal rates and removal selectivities in the step (4) can be calculated and listed in Table 1.

TABLE 1

| Example | 1 | 2 | 3 | 4 |
|---|---|---|---|---|
| Slurry pH | 3 | 4 | 5 | 6 |
| Removal rate of Al-alloy layer (Å/min) | 526 | 446 | 408 | 413 |
| Removal rate of Ti barrier layer (Å/min) | 1,171 | 1,177 | 1,648 | 2,413 |
| Removal rate of TiN barrier layer (Å/min) | 1,367 | 948 | 2,631 | 2,791 |
| Removal rate of $SiO_2$ dielectric layer (Å/min) | 57 | 26 | 51 | 65 |
| Removal selectivity (Al-alloy layer/ Ti barrier layer) | 0.45 | 0.38 | 0.25 | 0.17 |

According to the removal rates and removal selectivities of Examples 1–4, the two-step CMP method of the present invention contributes quite different removing rates to the Al-alloy layer, the Ti barrier layer, the TiN barrier layer, and the $SiO_2$ dielectric layer. In the other words, these two kinds of polishing slurries can provide excellent removal selectivities between the above layers. Additionally, the removal rates of the Al-alloy layer in the first step are over 4,000 Å/min, which indicates that the removal of overburden Al alloy is more efficient and overall throughput can be thus improved.

EXAMPLES 5–10

Repeat the steps of Example 1, but the first and the second polishing slurries were prepared in varied compositions as listed in Table 2. In Examples 5–10, samples with patterns of different line widths are employed, which include Al-alloy (98.5% Al, 0.5% Si, 1% Cu, about 1 μm thick), Ti (about 400 Å thick), and TN (50% Ti, 50% N, about 500 Å thick) therein.

TABLE 2

|  | The first polishing slurry | The second polishing slurry |
|---|---|---|
| Metal polishing promoter ($H_3PO_4$) | 5 wt. % | X |
| pH | 2 | 6 |
| Buffer (citric acid) | 0.1 M | 0.1 M |
| Oxidant ($H_2O_2$) | 3 wt. % | 5 wt. % |

TABLE 2-continued

|  | The first polishing slurry | The second polishing slurry |
|---|---|---|
| Abrasive (Al$_2$O$_3$) | 5 wt. %, α-Al$_2$O$_3$ of average particle size 0.3 μm | 3 wt. %, γ-Al$_2$O$_3$ of average particle size 0.05 μm |
| Dielectric layer protector (TBAH) | X | 0.01 M |

Next, the samples of Examples 5–10 were polished by repeating steps (1) and (3) of Example 1, which were then measured by a surface profilermeter to obtain their dishing depth (DD) and the calculated dishing ratios of DD versus LW. Such data are all listed in Table 3.

TABLE 3

| Example | 5 | 6 | 7 | 8 | 9 | 10 |
|---|---|---|---|---|---|---|
| Line width (LW) (μm) | 1.4 | 2.1 | 3.4 | 3.6 | 4.6 | 9.7 |
| Dishing depth (DD) (nm) | 52.0 | 52.8 | 84.0 | 93.3 | 130.9 | 133.0 |
| DD/LW (%) | 3.71 | 2.51 | 2.47 | 2.59 | 2.85 | 1.37 |

As shown in Table 3, metal dishing and oxide layer erosion are avoided when applying the two-step CMP method of the present invention. For the interconnections with different line widths, most ratios (dishing depth/line width) are less than 3%, that is, nearly flat wafer surfaces can be achieved in the present invention.

Although the present invention has been explained in relation to its preferred embodiment, it is to be understood that many other possible modifications and variations can be made without departing from the spirit and scope of the invention as hereinafter claimed.

What is claimed is:

1. A two-step CMP method for planarizing a wafer surface, said wafer surface contains an aluminum containing metal layer and a Ti/TiN barrier layer, said method comprising steps of:

(A) polishing said metal layer in a first polishing slurry, said first polishing slurry comprising an abrasive, a pH buffer, a metal polishing promoter, an oxidant, and deionized water; and (B) polishing said barrier layer in a second polishing slurry, said second polishing slurry comprising an abrasive, a pH buffer, a dielectric layer protector, an oxidant, and deionized water; and wherein said first polishing slurry in said step (A) comprises 30–99 wt. % deionized water, 0.5–60 wt. % abrasive, 0.01–10 wt. % metal polishing promoter, and 0.1–30 wt. % oxidant; and wherein said second polishing slurry in said step (B) comprises 30–99 wt. % deionized water, 0.5–60 wt. % abrasive, 0.01–10 wt. % dielectric layer protector, and 0.1–30 wt. % oxidant, and having a pH value between 2.0 and 7.0.

2. A polishing composition for planarizing a wafer surface in a two-step CMP process, said wafer surface contains an aluminum containing metal layer and a Ti/TiN barrier layer, said polishing composition comprising:

(a) a first polishing slurry comprising an abrasive, a buffer, a metal polishing promoter, an oxidant, and deionized water; and (b) a second polishing slurry comprising an abrasive, a buffer, a dielectric layer protector, an oxidant, and deionized water; and wherein said first polishing slurry comprises 30–99 wt. % deionized water, 0.5–60 wt. % abrasive, 0.01–10 wt. % metal polishing promoter, and 0.1–30 wt. % oxidant; wherein said second polishing slurry comprises 30–99 wt. % deionized water, 0.5–60 wt. % abrasive, 0.01–10 wt. % dielectric layer protector, and 0.1–30 wt. % oxidant, and having a pH value between 2.0 and 7.0.

* * * * *